United States Patent
Meng et al.

(10) Patent No.: US 8,980,696 B2
(45) Date of Patent: Mar. 17, 2015

(54) METHOD OF PACKAGING SEMICONDUCTOR DIE

(75) Inventors: Dominic Koey Poh Meng, Kuala Lumpur (MY); Zhiwei Gong, Chandler, AZ (US); Kesvakumar V. C. Muniandy, Klang (MY); Weng Foong Yap, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 646 days.

(21) Appl. No.: 13/292,103

(22) Filed: Nov. 9, 2011

(65) Prior Publication Data

US 2013/0113091 A1    May 9, 2013

(51) Int. Cl.
| | | |
|---|---|---|
| H01L 21/44 | (2006.01) | |
| H01L 21/48 | (2006.01) | |
| H01L 21/50 | (2006.01) | |
| H01L 23/48 | (2006.01) | |
| H01L 23/52 | (2006.01) | |
| H01L 29/40 | (2006.01) | |
| A01J 21/00 | (2006.01) | |
| A01J 25/12 | (2006.01) | |
| H01L 23/498 | (2006.01) | |
| H01L 21/56 | (2006.01) | |
| H01L 23/538 | (2006.01) | |
| H01L 23/00 | (2006.01) | |
| H01L 23/24 | (2006.01) | |
| H01L 23/31 | (2006.01) | |

(52) U.S. Cl.
CPC ........... *H01L 23/49816* (2013.01); *H01L 23/24* (2013.01); *H01L 23/3128* (2013.01); *H01L 21/561* (2013.01); *H01L 21/568* (2013.01); *H01L 23/5389* (2013.01); *H01L 24/19* (2013.01); *H01L 24/97* (2013.01); *H01L 2224/04105* (2013.01); *H01L 2224/12105* (2013.01)
USPC .................. 438/110; 257/734; 257/E21.502; 257/E23.116; 425/468

(58) Field of Classification Search
CPC ........................ H01L 21/561; H01L 23/49816
USPC ........... 438/110; 257/734, E21.502, E23.116; 425/468

See application file for complete search history.

(56) References Cited

U.S. PATENT DOCUMENTS

| | | | |
|---|---|---|---|
| 5,841,193 A | 11/1998 | Eichelberger | |
| 5,964,030 A * | 10/1999 | Lee et al. | .......................... 29/827 |
| 6,284,569 B1 * | 9/2001 | Sheppard et al. | ............. 438/110 |
| 7,202,107 B2 | 4/2007 | Fuergut et al. | |
| 7,245,011 B2 * | 7/2007 | Liu | ................ 257/724 |
| 7,674,656 B2 | 3/2010 | Wenzel et al. | |

(Continued)

*Primary Examiner* — David S Blum
(74) *Attorney, Agent, or Firm* — Charles Bergere

(57) ABSTRACT

A method of packaging a semiconductor die includes the use of an embedded ground plane or drop-in embedded unit. The embedded unit is a single, stand-alone unit with at least one cavity. The embedded unit is placed on and within an encapsulation area of a process mounting surface. The embedded unit may have different sizes and shapes and a number of different cavities that can be placed in a predetermined position on a substrate, panel or tape during processing of semiconductor dies that are embedded into redistributed chip package (RCP) or wafer level package (WFL) panels. The embedded unit provides the functionality and design flexibility to run a number of embedded units and semiconductor dies or components having different sizes and dimensions in a single processing panel or batch and reduces die drift, movement or skew during encapsulation and post-encapsulation cure.

16 Claims, 7 Drawing Sheets

(56) References Cited

U.S. PATENT DOCUMENTS

| | | | |
|---|---|---|---|
| 7,804,147 B2 * | 9/2010 | Tarsa et al. | 257/433 |
| 7,902,650 B2 * | 3/2011 | Hu et al. | 257/678 |
| 8,367,480 B2 * | 2/2013 | Pagaila | 438/124 |
| 8,399,300 B2 * | 3/2013 | Lee et al. | 438/118 |
| 8,409,885 B2 * | 4/2013 | Chan et al. | 438/26 |
| 2003/0194835 A1 * | 10/2003 | Kim et al. | 438/113 |
| 2004/0212083 A1 * | 10/2004 | Yang | 257/723 |
| 2007/0212813 A1 | 9/2007 | Fay et al. | |
| 2012/0056336 A1 * | 3/2012 | Ou et al. | 257/778 |
| 2014/0008779 A1 * | 1/2014 | Okuno et al. | 257/684 |

* cited by examiner

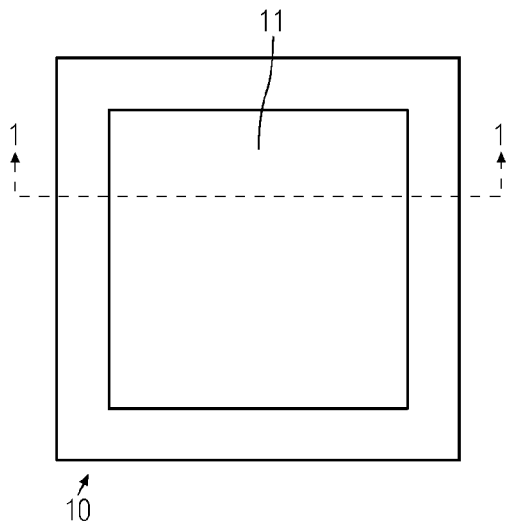
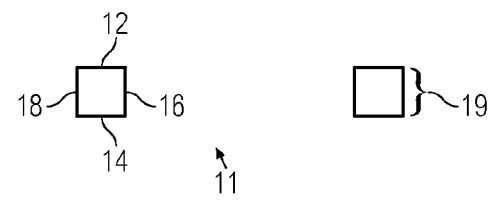
FIG. 1  FIG. 2
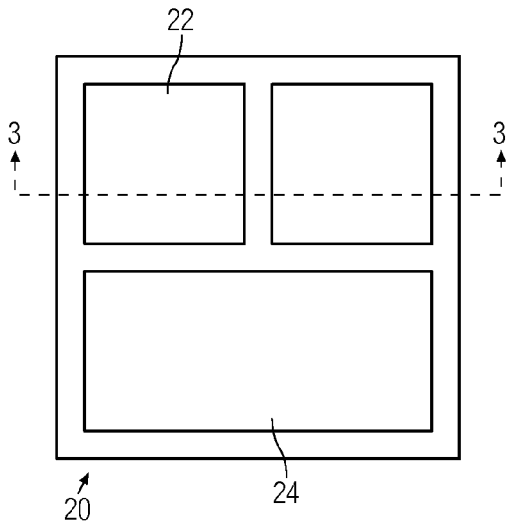
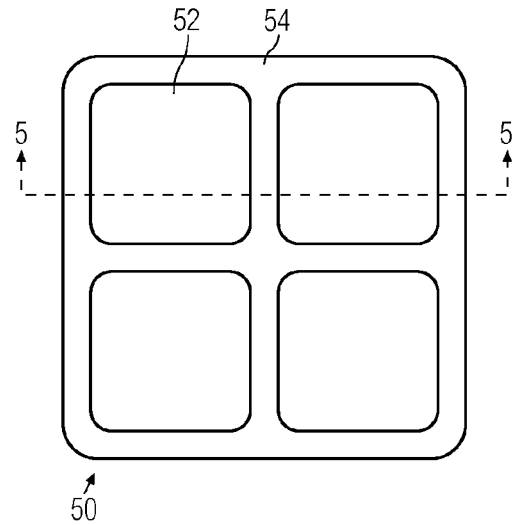
FIG. 3  FIG. 5
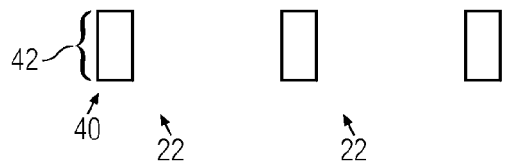
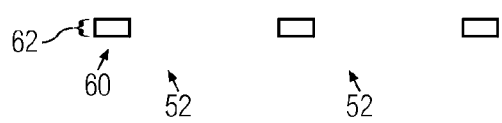
FIG. 4  FIG. 6

METHOD OF PACKAGING SEMICONDUCTOR DIE

BACKGROUND OF THE INVENTION

The present invention relates to packaging of integrated circuits and, more particularly, to encapsulating semiconductor dies with an encapsulation material.

Semiconductor packages are containers for integrated circuits formed on a semiconductor die. Typically, the die is encapsulated with an encapsulant material such as a plastic resin that forms a protective exterior surface of the semiconductor package. The package has electrical interconnects between contact pads of the integrated circuit on the die and exposed input/output (I/O) pins for interconnecting the integrated circuit with external circuitry.

In the process of encapsulating the die, during curing of the encapsulant, the properties of the encapsulant material can cause the die to drift and move position. This post-encapsulation cure, die drift, or skew results in the die having a different actual post-encapsulation position than when it was initially placed on a panel before the encapsulation process. Die drift complicates later high precision processing steps, such as interconnecting die bonding pads or connection points of the die with interconnects, feature and trace positioning on photo masks, and aperture positioning on printing or ball drop screens for connection between die bonding pads to metal layers and bumps or balls. Any misalignment or miscoupling between the interconnects and the die pads may result in device and package failure, lowering manufacturing yield.

In an attempt to compensate for die drift, a pick and place position of the die on the surface support panel or frame is determined before encapsulation using empirical data. However, relying on die pitch compensation still results in misalignments between connection points and interconnects. In particular, the error associated with die pitch compensation has been increasing due to the industry trend for a smaller chip footprint yet with an increased density of connection points and interconnects.

In an attempt to overcome the limitations of die pitch compensation, a sheet of perforated single plane metal known as an embedded ground plane plate or frame has been implemented in the die encapsulation process. The embedded ground plane plate is positioned on top of and extends across the entire area or breadth of the mold or encapsulating area of the panel or substrate surface. A die is placed on the substrate surface in each perforated area of the embedded ground plane plate. Although in the advent of embedded ground plane plates some improvements have been achieved in reducing die drift or skew, there are limitations with the use of conventional embedded ground planes. During assembly, a single embedded ground plane plate or sheet is used. Often, however, it is desirable to have different thicknesses and materials of the embedded ground plane plate around different sized semiconductor dies with different sizes and dimensions and electrical, thermal and mechanical requirements in a single batch.

Another limitation with conventional embedded ground plane plates is panel warpage caused by an imbalance of panel expansion after encapsulation cure between the embedded components of the panel in the encapsulant. As the embedded ground plane plate extends across the entire area of the surface of the panel, when the panel warps, the panel is not able to be adequately held to a wafer chuck table by a vacuum without additional assistance such as a mechanical stiffener. However, mounting a mechanical stiffener to the panel introduces additional cost and processing time.

Additionally, with traditional embedded ground plane plates there can be package reliability failure due to delamination propagation that arises at the embedded ground plane plate to the encapsulant interface and embedded ground plane plate to dielectric interface during package sawing at singulation, which contributes to lower processing yield. Accordingly, there is a need for addressing or at least alleviating the above limitations and problems.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to those embodiments described. On the contrary, the intent is to cover all alternatives, modifications and equivalents as included within the scope of the invention as defined by the appended claims. In the drawings:

FIG. 1 is a top plan view of an embedded unit in accordance with an embodiment of the invention;

FIG. 2 is a cross-sectional view of the embedded unit taken along the dashed line 1-1 of FIG. 1 in accordance with an embodiment of the invention;

FIG. 3 is a top plan view of an embedded unit with multiple cavities in accordance with an embodiment of the invention;

FIG. 4 is a cross-sectional view of the embedded unit taken along the dashed line 3-3 of FIG. 3 in accordance with an embodiment of the invention;

FIG. 5 is a top plan view of an embedded unit with multiple uniform cavities in accordance with an embodiment of the invention;

FIG. 6 is a cross-sectional view of the embedded unit taken along the dashed line 5-5 of FIG. 5 in accordance with an embodiment of the invention;

DETAILED DESCRIPTION

Figure 7:
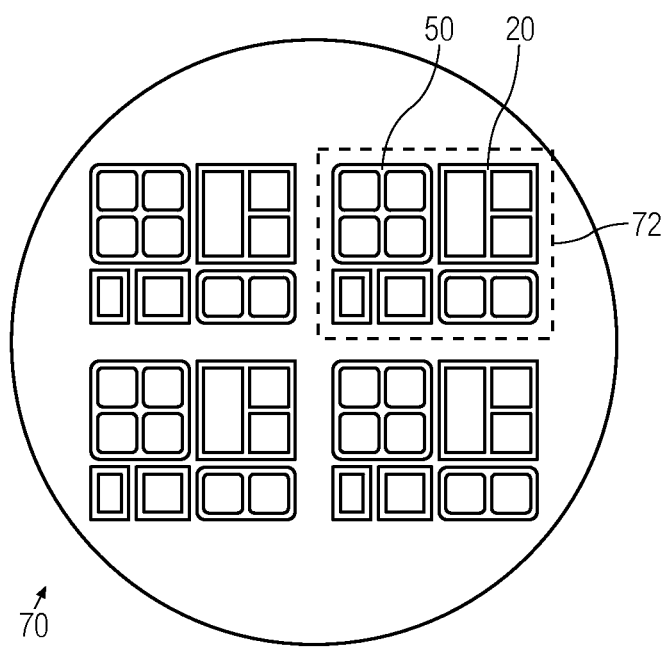
FIG. 7 is a top plan view of a plurality of embedded units mounted on a process mounting surface of a processing substrate in accordance with an embodiment of the invention.

An aspect of the invention is a method of forming a packaged integrated circuit, comprising of providing a process mounting surface having an encapsulating area; placing an embedded unit on the process mounting surface within the encapsulating area, the embedded unit having a first surface, an inner surface and an outer surface, the first surface of the embedded unit having an opening defined by the inner surface through the embedded unit, and the first surface positioned on the process mounting surface for forming a cavity; and placing an integrated circuit on the process mounting surface within the cavity of the embedded unit, the integrated circuit having electrical contacts for electrical connection with external circuitry. The embedded unit and the integrated circuit assembly are arranged to reduce movement of the integrated circuit assembly during packaging. Finally, encapsulating the inner and outer surface of the embedded unit and the integrated circuit with an encapsulant material is performed for forming the packaged integrated circuit.

In one embodiment, the process mounting surface is a substrate, and the method includes removing the process mounting surface of the panel to expose the electrical contacts of the integrated circuit.

In an embodiment, the packaged integrated circuit comprises at least two layers and the process mounting surface is a surface on a layer within the packaged integrated circuit.

In an embodiment, at least two embedded units are placed on the process mounting surface and within the encapsulating area of the process mounting surface, wherein each of the at least two embedded units are separate, placing at least one integrated circuit within each cavity of each embedded unit, the first surface of each of the at least two embedded units arranged to be spaced apart on the process mounting surface and separated by encapsulant material. At least two packaged integrated circuits may be formed from the at least two embedded units without penetrating any part of any one of the at least two embedded units. The at least two embedded units have the same or different dimensions and/or materials.

In an embodiment, the first surface of the embedded unit has at least two openings through the embedded unit, and placing an integrated circuit on the process mounting surface in each cavity formed by the at least two openings. The two openings may have the same or different dimensions.

In an embodiment, the placing of the integrated circuit on the process mounting surface is performed before placing the embedded unit on and within the encapsulating area of the process mounting surface.

In an embodiment, at least two embedded units are placed on the process mounting surface within the encapsulating area of the process mounting surface, wherein each of the at least two embedded units are joined, placing at least one integrated circuit within each cavity of each embedded unit, removing material from between each adjacent embedded unit of the at least two embedded units to form a gap and separate embedded units, wherein the first surfaces of each of the at least two embedded units are spaced apart on the process mounting surface and each of the at least two embedded units are separate and unjoined.

An aspect of the invention is a packaged integrated circuit, comprising a process mounting surface plane; an embedded unit having a first surface, an inner surface and an outer surface, the first surface having an opening through the embedded unit defined by the inner surface, and the first surface on the process mounting surface plane; an integrated circuit having a first surface and a second surface, the first surface of the integrated circuit on the process mounting surface plane, the integrated circuit positioned within the opening defined by the inner surface of the embedded unit, the integrated circuit having electrical contacts for electrical connection with external circuitry, the embedded unit and the integrated circuit device arranged to inhibit, reduce or minimize movement of the integrated circuit assembly during encapsulation; and an encapsulant material encapsulating at least a portion of the outer surface of the embedded unit, the inner surface of the embedded unit, and the second surface of the integrated circuit for forming the packaged integrated circuit.

In an embodiment, the process mounting surface plane is a surface that is formed by a temporary surface that is removed to expose the electrical contacts of the integrated circuit. The temporary surface may be a substrate, panel, or tape.

In an embodiment, the packaged integrated circuit comprises at least two layers and the process mounting surface plane is formed by a surface on a layer within the packaged integrated circuit.

In an embodiment, at least two embedded units are on the process mounting surface plane; each outer surface of the two embedded units are separated by encapsulation material; at least one integrated circuit is on the process mounting surface plane within each cavity of each embedded unit; and each integrated circuit is separated by encapsulation material from the inner surface of each respective embedded unit. The packaged integrated circuit may be formed from a single process mounting surface plane comprising at least two embedded units and singulated to form at least two packaged integrated circuits without penetrating any part of any one of the at least two embedded units.

In an embodiment, the first surface of the embedded unit has at least two openings through the embedded unit, each opening defined by an inner surface of the embedded unit, an integrated circuit positioned on the process mounting surface plane within each opening.

In an embodiment, the packaged integrated circuit has at least two embedded units and each embedded unit has uniform or different dimensions and/or materials.

An aspect of the invention is an embedded unit for a packaged integrated circuit that reduces, inhibits or minimizes movement of an integrated circuit on a process mounting surface during encapsulation. The embedded unit includes a body having a first surface, an inner surface, and an outer surface. The first surface has an opening through the embedded unit defined by the inner surface, and the first surface is positioned on a process mounting surface within an encapsulating area for forming a cavity to receive an integrated circuit on the process mounting surface, and the outer surface and the inner surface for being encapsulated by an encapsulation material.

In an embodiment, the embedded unit has at least two openings through the first surface of the embedded unit, wherein the two openings are uniform or different dimensions.

An embedded unit and method of packaging an integrated circuit such as a semiconductor die and/or other component in accordance with an embodiment of the present invention will now be described. Referring to FIG. 1, an embedded unit 10 or drop-in embedded unit aids in maintaining the placing, alignment, positioning or the like, of an integrated circuit such as a semiconductor die during packaging to reduce, inhibit or minimize the effects and movements known as die drift or skew. The embedded unit 10 is a single drop-in standalone unit with at least one opening, hole, cavity 11, or the like. The embedded unit 10 is provided to fix and place or align the position of an integrated circuit on a process mounting surface and reduce skew, drift, movement and the like of the integrated circuit during encapsulation. It will be appreciated that the embedded unit may be arranged in different sizes, shapes, forms, thicknesses, materials, dimensions and the like, with any number of different openings or cavities that can be placed in a predetermined position on a substrate, panel or tape during packaging of semiconductor dies that are embedded into redistributed chip package (RCP) or wafer level package (WFL) panels of the packaged semiconductor device. The embedded unit 10 provides the functionality and design flexibility to process a number of embedded units and semiconductor dies or components having a variety of different sizes, shapes, forms, thicknesses, materials, dimensions, and the like in a single processing panel or batch to reduce, inhibit or minimize die drift, movement, skew, or the like, as well as reduce packaging costs and wastage. It will be appreciated that the processing surface upon which the embedded unit 10 is placed may be the surface of a panel as shown in the drawings, or other surfaces such as processing surfaces at different layers within a packaged semiconductor having multiple layers.

FIG. 2 is a cross-sectional view of the embedded unit taken along the dashed line 1-1 of FIG. 1 in accordance with an embodiment of the invention. The embedded unit 10 has a first side that is a top surface 12, a second side that is the bottom surface 14, a third side that is an inner surface 16, and a fourth side that is the outer side surface 18 of embedded unit. The outer side surface 18 of the embedded unit forms the outer perimeter of the embedded unit, while the inner surface 16 of the embedded unit forms the outer perimeter of the opening or cavity of the embedded unit. The outer perimeter, or outer surface of the embedded unit is placed within the outer perimeter of the process mounting surface and encapsulated, at least along one side, with encapsulant material during processing as shown and discussed in greater detail with reference to FIG. 7-9. The thickness 19 of embedded unit is shown by the bracket along the outer side surface 18 of the embedded unit. It will be appreciated that the thickness may be any thickness required for any particular specification or application. The dimensions of the embedded unit 10 such as thickness, number of cavities and the like are largely selected as dependent on the shape and dimensions of the semiconductor die that the embedded unit 10 is to minimize die drift or skew.

The material of the embedded unit 10 may be any material suitable for any particular specification or application. The material of the embedded unit 10 may be copper (Cu), Cu-alloy, other metals, other metal alloys, glass, ceramic, plastic, plastic impregnated fibreboard, silicon, polymer compounds, combinations thereof, or the like. It will be appreciated that the material of the embedded unit listed here is not intended to be limiting.

As each embedded unit 10 is a single standalone unit, multiple embedded units 10 may be placed on a single panel during each processing batch. Each embedded unit 10 may be the same as or different from other embedded units placed on the same panel. For example, each embedded unit may be the same or different unit material, shape, size, thickness, cavity size, cavity shape, or the like, from other embedded units on the same panel.

FIG. 3 is a top plan view of an embedded unit 20 with multiple openings, holes or cavities 22, 24 in accordance with an embodiment of the invention. The size and shape of the cavities may be the same or different. In this embodiment, three cavities are shown, two cavities 22 having the same size and square shape, and another cavity 24 with a different size and rectangular shape. Each embedded unit may have multiple cavities with each embedded unit and cavities having different shapes, sizes, thicknesses, and dimensions. For example, the embedded unit itself is shown as a square shape, however, the shape, size and dimensions of the embedded unit may differ and may be any number of shapes such as rectangular, circular, triangular, hexagonal, or the like. Similarly, the shape, size and dimensions of the cavities within the embedded unit may be the same or differ and may be any number of shapes such as rectangular, circular, triangular, hexagonal, or the like. The cavities, openings or holes made in the embedded unit may be made by a number of procedures, such as for example by punching, etching, molding, laser scribing, combinations thereof, or the like. Each embedded unit has an outer perimeter defined by the outer surface 18, and each opening or cavity defined by the inner surface 16 of each opening of the embedded unit defines an outer perimeter of the opening and an inner perimeter of the embedded unit. Each outer perimeter, or outer surface of the embedded unit is placed within the outer perimeter of the process mounting surface and encapsulated, at least along one side, with encapsulant material during processing as shown and discussed in greater detail with reference to FIG. 7-9.

FIG. 4 is a cross-sectional view 40 of the embedded unit 20 taken along the dashed line 3-3 of FIG. 3 in accordance with an embodiment of the invention. The thickness 42 of the embedded unit 20 is shown with brackets. The thickness 42 of embedded unit 20 is different from the thickness 19 of embedded unit 10 shown in FIG. 1 and FIG. 2. It will be appreciated that the thickness of the embedded unit 10,20 may be any thickness that is suitable for a particular application or specification, and that the examples shown and discussed here are for illustration purposes. Both embedded units 10,20 may have the same thickness, or thickness 42 may be more or less than thickness 19. In this embodiment the thickness of the embedded unit may range from between for example in the range of 2 mils (50 um) to 25.5 mils (650 um). The shape, thickness and size of the embedded unit are a design choice based on different factors and mechanical, thermal and electrical requirements depending on the specific application of the device. For example, in one embodiment there may be an electromagnetic field generated from one die that may impact the performance of a neighbouring die. The embedded unit may be designed to shield or contain the electromagnetic field. The embedded unit may be designed to have the required thickness around the die affected by the electromagnetic field and/or around the die generating the electromagnetic field to shield or contain the generated electromagnetic field to prevent the electromagnetic field from affecting other dies. In another embodiment, the embedded unit shape may be designed to accommodate discrete or passive components that are next to or proximate the die. In an embodiment, the embedded unit shape may be designed to channel heat produced by a die through the embedded unit to the environment.

Another design choice is the size of the gap between the die and embedded unit, as well as the distance between the cavity. These aspects may be based on different factors such as a combination of mechanical, thermal and electrical requirements depending on the specific application of the device. For example, in an embodiment, due to certain filler size of the encapsulant, a gap of at least the filler size between the die and embedded unit may be implemented. For another application, the distance between cavity as well as the area of the embedded unit may be selected to achieve the optimal package stress during reliability testing.

FIG. 5 is a top plan view of an embedded unit 50 with multiple uniform cavities in accordance with an embodiment of the invention. The embedded unit 50 with multiple cavities with uniform dimensions is shown. The embedded unit 50 is shown with fillet corners 54. It will be appreciated that the corners may take different configurations such as sharp, rounded, filleted or the like. As mentioned with respect to FIG. 1 and FIG. 3, each embedded unit has an outer perimeter defined by the outer surface 18, and each opening or cavity defined by the inner surface 16 of each opening of the embedded unit defines an outer perimeter of the opening and an inner perimeter of the opening. Each outer perimeter, or outer surface of the embedded unit is placed within the outer perimeter of the process mounting surface and encapsulated, at least along one side, with encapsulant material during processing as shown and discussed in greater detail with reference to FIGS. 7-9.

FIG. 6 is a cross-sectional view 60 of the embedded unit 50 taken along the dashed line 5-5 of FIG. 5 in accordance with an embodiment of the invention. The thickness 62 of the embedded unit 50 is shown with brackets. The thickness 62 of embedded unit 50 is different from the thickness 19, 42 of embedded units 10,20 shown in FIGS. 1-4.

FIG. 7 is a top plan view 70 of a plurality of embedded units 20, 50 mounted on a process mounting surface and encapsulating area of a processing substrate in accordance with an embodiment of the invention. The panel 70 is shown with embedded units 20,50 having different configurations such as the embedded units shown in FIG. 1-6. A space, gap, area, or the like between the each adjacent outer surface of each embedded unit 20,50 and the outer perimeter of the encapsulating area of the panel or substrate is shown within the cavity of each embedded unit. The embedded units can be arranged in any orientation relative to other embedded units within the encapsulating area. The dashed box 72 shows several embedded units in more detail in FIG. 8.

Figure 8:
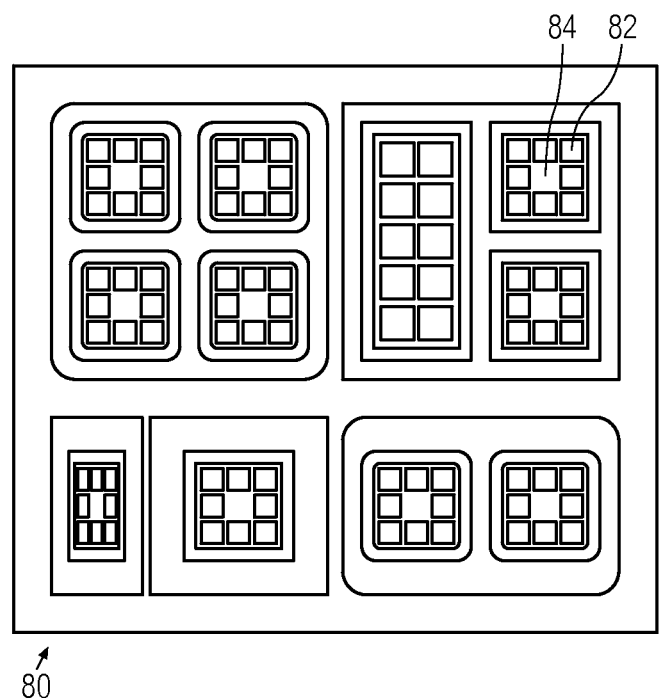
FIG. 8 is a top plan view of the dashed box area of FIG. 7 shown in more detail.

FIG. 8 is a top plan view 80 of the dashed box area 72 of FIG. 7 shown in more detail. Multiple embedded units are shown with different embedded unit shapes and configurations and with different cavity shapes and configurations. Also FIG. 8 shows each cavity with at least one component or die 82 positioned within the cavity. A space, gap, area 84, or the like between the die 82 and the inner surface or side of the embedded unit or adjacent die is shown within the cavity of each embedded unit. The dies, integrated circuit devices, components, or the like can be arranged in any orientation relative to other dies, integrated circuit devices, components, or the like within cavity on the surface of the panel or substrate within the encapsulating area. It will be appreciated that multiple components may be placed within each cavity. Multiple components may be dies placed with other dies, passive devices such as capacitors or the like.

It will be appreciated that the actual number of dies or dies and components in a cavity of the embedded unit is a design choice, which may depend upon a number of factors including the thermal, mechanical and electrical requirements for the specific application and/or specific final device requirement.

Figure 9:
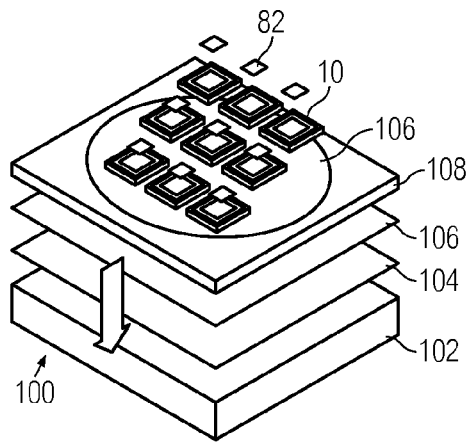
FIG. 9 is a perspective view of placement of a plurality of dies and embedded units on a process mounting surface of a processing substrate in accordance with an embodiment of the invention.

FIG. 9 is a perspective view 100 of placement of a plurality of integrated circuit assemblies or dies and embedded units 10 on a process mounting surface of a processing substrate in accordance with an embodiment of the invention. It will be appreciated that the layers of the substrate and process mounting surface shown in FIG. 9 in exploded view to show separately but in the sequence and relationship of the different layers of the whole substrate and process mounting surface in this embodiment. The arrow shows that the different layers are applied from bottom to top. The substrate and process mounting surface in this embodiment comprises a glass substrate 102, thermal release tape 104, double sided silicon polyimide tape 106, and mold frame 108. The mold frame 108 defines the mold or encapsulating area the embedded units are placed within. The dies 82 are shown to be placed within the cavity of each embedded unit. It will be appreciated that the process mounting surface that the embedded unit is placed may be the surface of a panel as shown in FIG. 9, or other surfaces such as processing surfaces at different layers within the packaged semiconductor having multiple layers. In FIG. 7-9 it is shown that each embedded unit has an outer perimeter defined by the outer surface 18 of each embedded unit, and each opening or cavity defined by the inner surface 16 of each opening of the embedded unit defines an inner perimeter of the embedded unit and an outer perimeter of the opening. Each outer perimeter 18, or outer surface of the embedded unit is placed within the outer perimeter of the process mounting surface or encapsulating area and encapsulated, at least along one side or along a portion of the outer surface 18, with encapsulant material during processing as shown and discussed in greater detail with reference to FIG. 7-9. By encapsulating all or a portion of the outer surface or perimeter 18 of the embedded unit, the drop-in character of the embedded units and the design flexibility advantages in accordance with embodiments of the invention are achieved.

Figure 10:
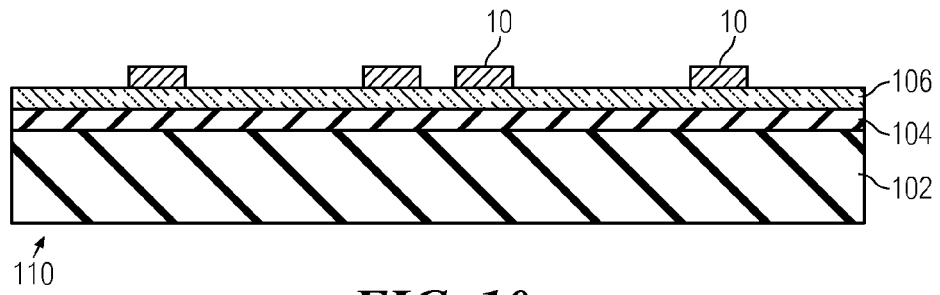
FIGS. 10-17 are enlarged cross-sectional views of different stages in a semiconductor assembly or packaging process using an embedded unit in accordance with an embodiment of the invention.
Figure 11:
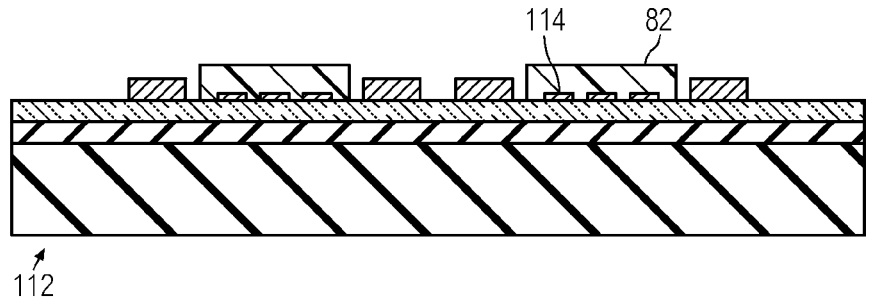

FIGS. 10-17 are cross-sectional views of different stages in a process of forming packaged semiconductor devices with an embedded unit in accordance with an embodiment of the invention. FIG. 10 shows cross sectional view 110 of the process of forming a packaged semiconductor device with an embedded unit 10 where the embedded unit placed on double sided silicon polyimide tape 106. As shown in FIG. 9, the double sided silicon polyimide tape 106 is applied to thermal release tape 104 on top of the glass substrate 102. It will be appreciated that the bond force of the tape adherence should be sufficient such that there should not be any bleeding of encapsulant underneath the die pads because the encapsulant will cover the die pads and prevent connectivity. The pick and place machine used to place the devices has a bond force acting downwards on the embedded unit, dies and passive components during placement on the tape-glass substrate. The bond force should be optimized to get good placement and check for bleed performance to ensure good adhesion. In FIG. 11, the dies 82 are shown to be placed within the cavity of each embedded unit. It will be appreciated that the dies may be placed in any order, prior to or after the placement of the embedded unit.

FIG. 11 shows a cross-sectional view 112 of the process of forming a packaged semiconductor device with an embedded unit, with dies 82 placed in each cavity of each embedded unit. The dies are shown with electrical connectors or die pads 114 for connection with external circuitry (not shown). Although it is shown in FIG. 11 that the thickness of the embedded unit is thinner than the thickness of the die, it will be appreciated that the thickness of the embedded units may be thicker, thinner or the same size as the die or integrated circuit assembly.

Figure 12:
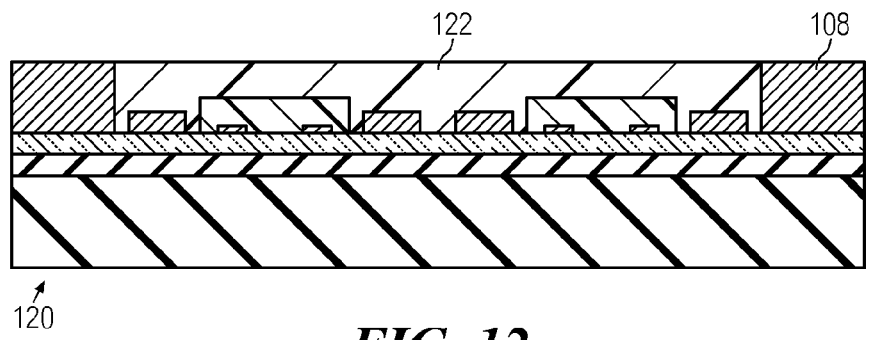

FIG. 12 shows a cross-sectional view 120 of the process of forming a packaged semiconductor device with an embedded unit, with mold frame 108 in place, and with mold material or encapsulant 122. The integrated circuits (IC) dies and embedded units are encapsulated or covered with encapsulation print/fill epoxy material. In an embodiment, devoid and partial cure is applied with vacuum and heat applied to panel to release trapped air bubbles in the encapsulant. The embedded units are arranged on the process mounting surface 104 in a spaced apart placement. A gap is shown between each embedded unit and the gap is filled by encapsulant material 122. The outer surface 18 and the inner surface 16 of each embedded unit is encapsulated with encapsulant material. Each outer surface 18 of each embedded unit is separated from an adjacent embedded unit by mold or encapsulant material 122. Similarly, each inner surface 16 defining the opening of the embedded unit is separated from the integrated circuit device such as the die 82 shown by mold or encapsulant material 122.

It will be appreciated that due to the drop-in character or nature of the embedded unit 10, the embedded unit may be positioned anywhere within the encapsulating or mold area of the process mounting surface. It is shown in FIG. 10-12 that each embedded unit 10 is spaced apart from adjacent embedded units, and spaced apart from the mold frame 108, and that the entire outer surface 18 forming the outer perimeter of the embedded unit is encapsulated with encapsulant or mold material 122. An embedded unit 10 may, however, be positioned to have a side of the outer surface 18 abutting the mold frame 108 with the other sides or portions of the outer surface 18 encapsulated with the encapsulant material 122. Similarly, in another embodiment an embedded unit 10 may be positioned to have a side or portion of the outer surface 18 abutting a side or portion of the outer surface of an adjacent embedded unit with the other sides or portions of the outer surface of both abutting embedded units are able to be encapsulated with encapsulant material 122.

Figure 13:
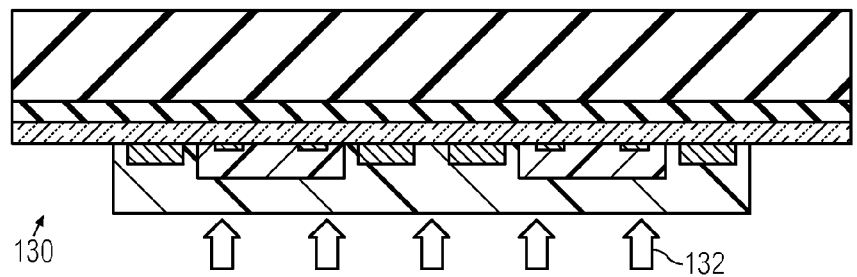

FIG. 13 shows a cross-sectional view 130 of the process of forming a packaged semiconductor device with an embedded unit of FIG. 12 with the die mold frame 108 removed and removal of the backside in accordance with an embodiment of the invention. The structure of FIG. 12 is shown flipped 180° to process the backside, with arrows 132 to show backside removal, encapsulant grinding, or the like. For example, the encapsulant is grinded to a desired thickness such as for example 0.65 mm.

Figure 14:
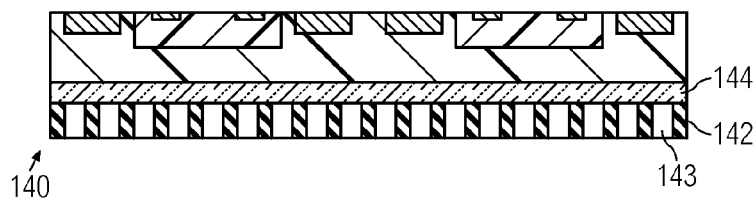

FIG. 14 shows a cross-sectional view 140 of the process of forming a packaged semiconductor device with an embedded unit of FIG. 13 in accordance with an embodiment of the invention with backside removed and the structure of FIG. 13 flipped 180° to process backside. Ceramic substrate 142 is processed with arrayed holes 143 and tape 144 is applied. Tape 144 may be any tape used in the industry suitable for the process such as silicon adhesive or the like. An example of tape is a silicon adhesive tape such as ARclad 7876 Transfer Adhesive from Adhesives Research Inc. of Glen Rock, Pa., United States of America.

Carrier attach is provided with ceramic stiffener attached to panel encapsulant by tape. Thermal debond is achieved for example at 150° C. for 2.5 minutes to remove thermal release tape from glass substrate followed by peeling of double sided silicon polyimide tape from panel, for example the active die side as shown. Encapsulant cure for example of 150° C. for 60 minutes is applied for full encapsulant polymerization process. The panel may be cleaned with a cleaning material solvent such as sulphonic acid and isopropyl alcohol to remove tape residue on die active area. An example of a sulphonic acid solvent commercially available is dynasolve which is dodecyl-benzene-sulfonic acid produced by Dynaloy Company of Indianapolis, Indianapolis, United States of America.

Figure 15:
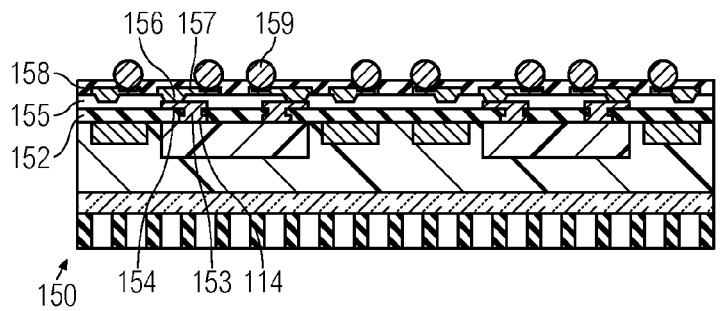

FIG. 15 shows a cross-sectional view 150 of the process of forming a packaged semiconductor device with an embedded unit of FIG. 14 with interconnections processed for external circuitry (not shown) in accordance with an embodiment of the invention. A die pad 114, a first dielectric layer 152, a first via 153, a first metal 154, a second dielectric layer 155, a second via 156, a second metal 157, a solder mask layer 158, and solder balls or bumps 159 are formed, positioned and aligned to provide the electrical interconnections from the integrated circuitry and devices of the die to external circuitry.

In more detail, the steps in processing the embedded unit shown in FIG. 15 comprises of steps A-F for the formation of the first dielectric layer 152, first via 153, and first metal layer 154. More specifically the first step A is for the formation of first dielectric layer 152 and via 153 (dielectric layer 1, 152 and via 1, 153), and the steps B to F is for the formation of $1^{st}$ metal layer traces (metal 1, 154). If more metal layers are required steps A to F are repeated. In the embodiment shown in FIG. 15 containing two metal layers, the steps A to F are repeated.

In step A for formation of the first dielectric layer 152 and first via 153, the dielectric photolithography processes comprises: 1) first dielectric layer 152 spin coat; 2) exposure and develop to form first via (via 1) 153; and 3) dielectric curing.

In step B to F for formation of the first metal layer 154, step B (not shown in FIG. 15) comprises sputtering a thin layer of seed metal layer, for example, by sputtering a thin layer of titanium tungsten (TiW) seed metal followed by a thin layer of copper (Cu) seed metal. Step C (not shown in FIG. 15) the photo resist photolithography processes that comprise: 1) photo resist coat; 2) photo resist exposure to have metal 1 traces patterned on photo resist; and 3) develop out patterned traces for metal 1 plating in subsequent process. Step D (not shown in the FIG. 15) comprises metal 1 electroplating, which for example is electroplate a layer of copper (Cu) on patterned traces to form metal 1 layer traces. Step E (not shown FIG. 15) is a photo resist strip-removal of photo resist in between metal 1 traces. Step F (not shown in FIG. 15) is seed metal etching and metal 1 roughening that comprises: 1) removal of seed metal through etching in between metal 1 traces to prevent shorting between 2 traces. In this example the seed metal removal is titanium tungsten (TiW) and copper (Cu) seed metal; and 2) metal 1 traces are micro etched to roughen the traces surface. In this example is copper surface (Cu).

If additional metal layers are required, steps A to F are repeated. In this embodiment shown in FIG. 15, steps A to F are repeated before forming the solder mask layer 158. More specifically, step A is repeated to form second dielectric layer 155 and via 156 (dielectric layer 2, 155 and via 2, 156), and steps B)→C)→D)→E)→F) to form second metal layer traces (metal 2) 157. Actually, to form solder mask layer 158 is to repeat step A. A solder mask opening is also formed prior to placing solder bump or ball 159. In this example, the solder mask layer is made of dielectric that comprises: 1) a dielectric spin-coat; 2) exposure and develop to form solder mask opening; and 3) solder mask curing. The solder bump or solder ball processes comprises: 1) solder paste print or solder ball drop; and 2) reflow to form solder bump or solder ball 159. Example of reflow temperature is 250° C.

The embedded unit may be implemented in different device configurations. The device shown in FIG. 15 is just one illustration. It will be appreciated that the device may be configured with only one metal layer such that steps A to F are only done once. Of course, steps A-F may be repeated any number of times for any number of dielectric layers, vias and metal layers. Repeat A to F if more than one metal layer is needed. The example shown in FIG. 15 and discussed here is up to two metal layers.

Figure 16:
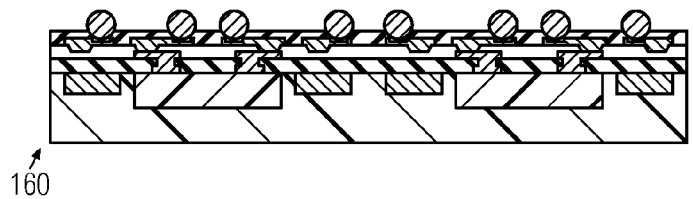

FIG. 16 shows a cross-sectional view 160 of the process of forming a packaged semiconductor device with an embedded unit of FIG. 15 with processing substrate and surface for example with silicon adhesive tape and ceramic with arrayed holes removed in accordance with an embodiment of the invention. The ceramic may be removed through sulphonic acid solvent such as dynasolve dissolving the silicon adhesive tape through ceramic holes.

Figure 17:
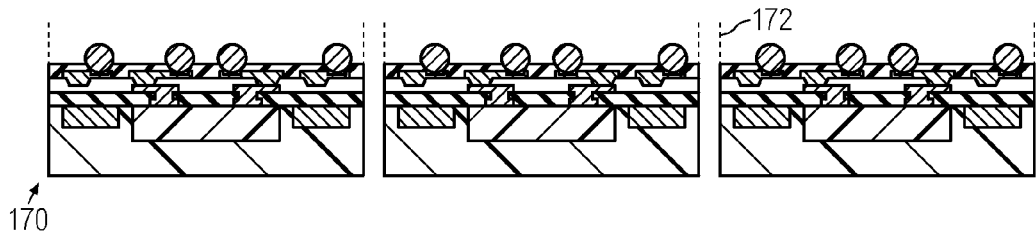

FIG. 17 shows a cross-sectional view 170 of the process of forming a packaged semiconductor device with an embedded unit of FIG. 16 where the plurality of die-embedded unit-interconnects are separated at the scribe width region 172 denoted as dash line into individual package/device. One method of separation is through package saw at saw scribe.

Figure 18:
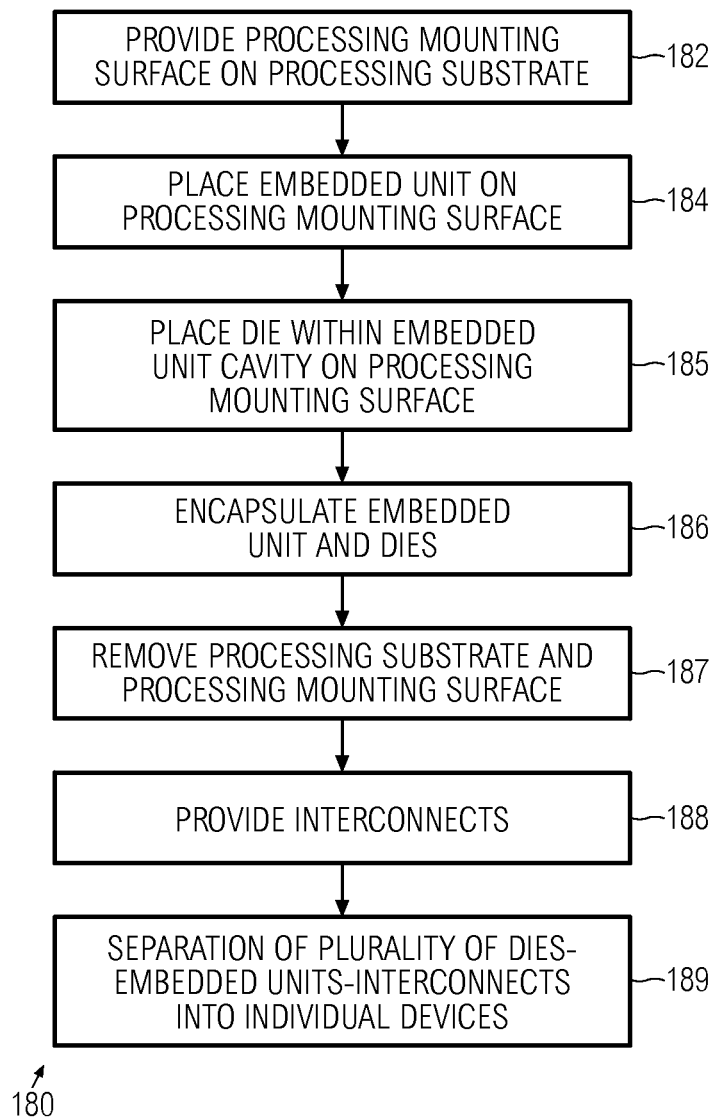
FIG. 18 is a flow chart showing a method of forming a packaged semiconductor device with an embedded unit in accordance with an embodiment of the invention.

FIG. 18 is a flow chart showing a method of forming a packaged semiconductor device with an embedded unit in accordance with an embodiment of the invention. A process mounting surface is provided 182 on a processing substrate such as a glass substrate or the like. The process mounting surface of the processing substrate may take different forms such as for example thermal release tape layer and double sided silicon polyimide tape layer, or the like, as discussed herein. The embedded units and dies are placed 184,185 on the process mounting surface. It will be appreciated that the placing of the embedded units and the dies may take any order such that the embedded units may be placed before, after or simultaneously as the dies. The embedded units and the dies are encapsulated 186, and the processing substrate is removed 187 from the mounting surface layers. Additional processing is then provided to form 188 electrical interconnects between the integrated circuits and devices of the dies to external circuitry (not shown). The plurality of dies-embedded units-interconnects are separated 189 into individual devices.

Figure 19:
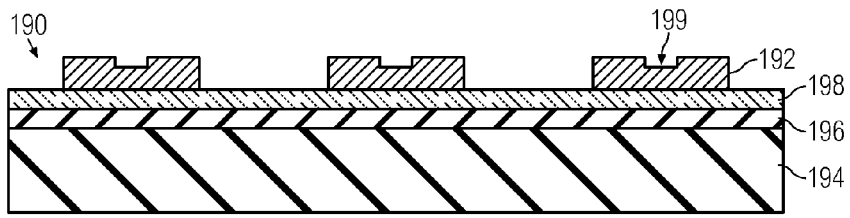
FIGS. 19-26 are enlarged cross-sectional views of different stages in preparing an embedded unit in accordance with an embodiment of the invention.

FIGS. 19-26 are cross-sectional views of different stages in preparing an embedded unit in accordance with an embodiment of the invention. FIG. 19 is a cross-sectional view 190 of embedded unit formation from an embedded ground plane plate in tape attach process in accordance with an embodiment of the invention, with embedded ground plane plate 192 with substrate 194, thermal release tape 196, double sided silicon polyimide tape 198, and embedded ground plane plate half-etch 199.

Figure 20:
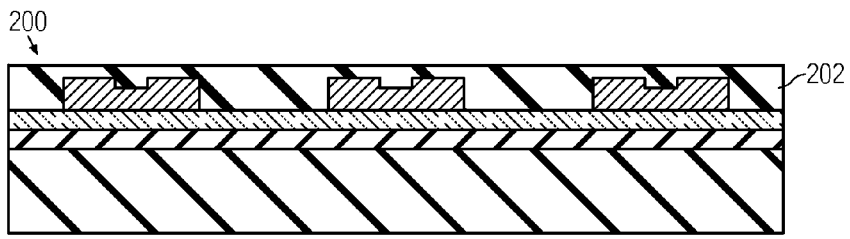

FIG. 20 is a cross-sectional view 200 showing the formation of an embedded unit from the embedded ground plane plate of FIG. 19 in a tape attach process in accordance with an embodiment of the invention. In this embodiment, a photo resist coat process is provided with a photo resist coat 202.

Figure 21:
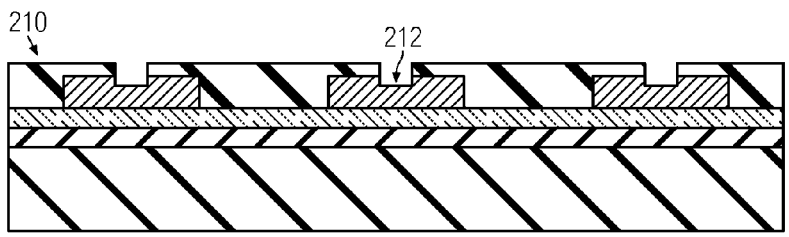

FIG. 21 is a cross-sectional view 210 showing the formation of an embedded unit from the embedded ground plane plate in the tape attach process of FIG. 20 with photo resist expose and develop at the embedded ground plane plate half-etch in accordance with an embodiment of the invention. This process exposes and develops photo resist at the embedded ground plane plate half-etch 212.

Figure 22:
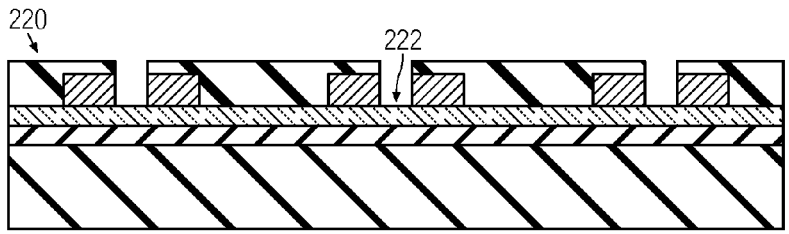

FIG. 22 is a cross-sectional view 220 showing the formation of an embedded unit from a conventional embedded ground plane plate. The embedded ground plane plate is etched at half-etch of the metal not protected by the photo resist 222.

Figure 23:
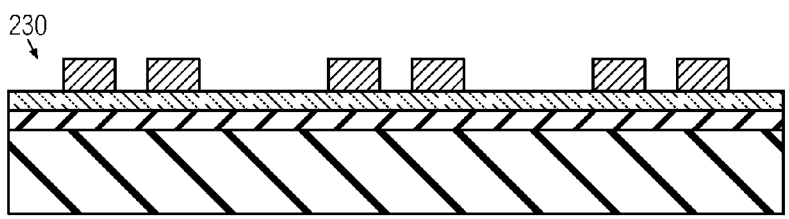

FIG. 23 is a cross-sectional view 230 showing the formation of an embedded unit from a conventional embedded ground plane plate in a tape attach process such as shown in FIG. 22 in accordance with an embodiment of the invention. In this embodiment a photo resist strip process removes the photo resist and exposes the embedded unit.

Figure 24:
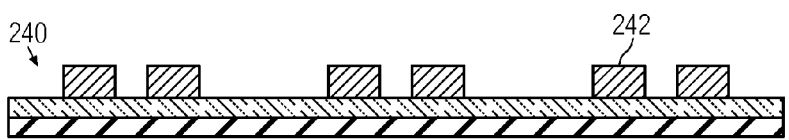

FIG. 24 is a cross-sectional view 240 showing the formation of an embedded unit in a tape attach process of FIG. 23 with the glass substrate removed by applying heat on glass substrate and thermal release tape until tape detaches from glass. The first surface 242 of embedded unit 242 is shown exposed in this step.

Figure 25:
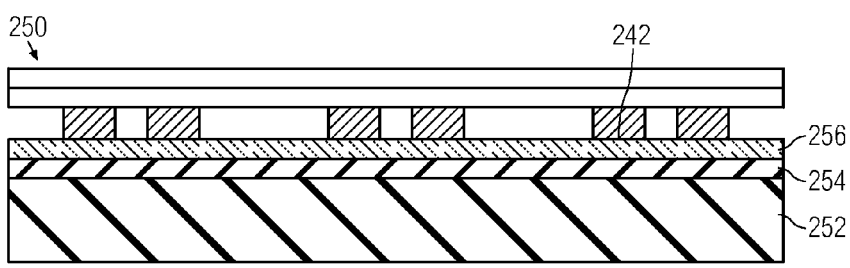

FIG. 25 is a cross-sectional view 250 showing the formation of an embedded unit in a tape attach process with the mount embedded unit held by tape to another glass substrate with thermal release tape and double silicon polyimide tape then peel tape off, with second glass substrate 252, second thermal release tape 254, and second double sided silicon polyimide tape 256.

Figure 26:
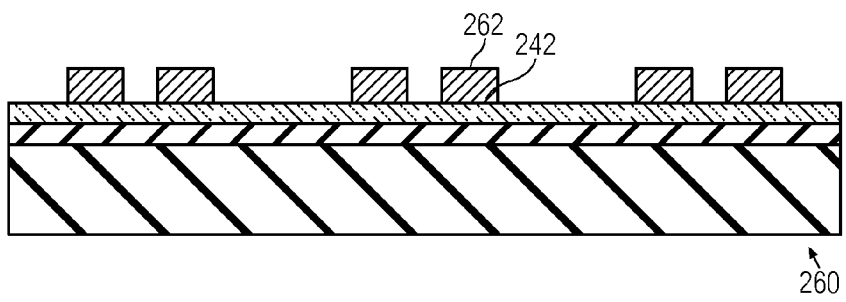

FIG. 26 is a cross-sectional view 260 showing the formation of an embedded unit in a tape attach process with the exposed second surface 262 of the embedded unit ready for die placement.

Figure 27:
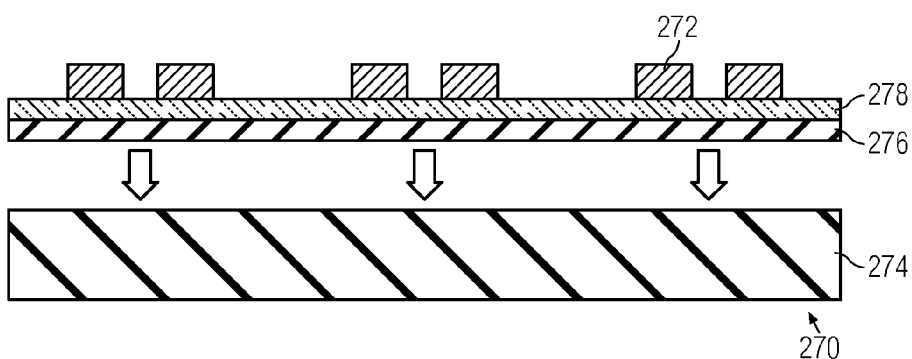
FIG. 27 is an enlarged cross-sectional view of an embedded unit to illustrate a mounting method in accordance with an embodiment of the invention.

FIG. 27 is another embodiment. FIG. 27 shows a cross-sectional view 270 of an embedded unit to illustrate another embedded unit mounting method in accordance with an embodiment of the invention. The pre-prepared embedded unit is provided on carrier tape and applied to a substrate. Specifically, the embedded unit 272 is attached to a glass substrate or carrier 274 with thermal release tape 276 and double sided silicon polyimide tape 278.

Figure 28:
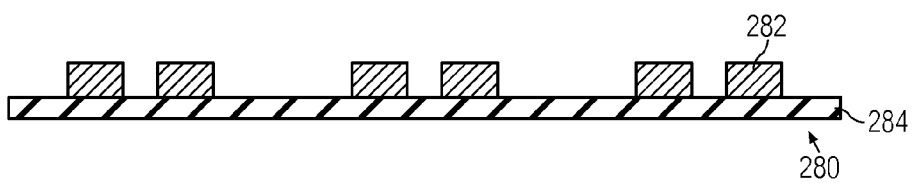
FIGS. 28 and 29 also are enlarged cross-sectional views of an embedded unit to illustrate a mounting method in accordance with an embodiment of the invention.
Figure 29:
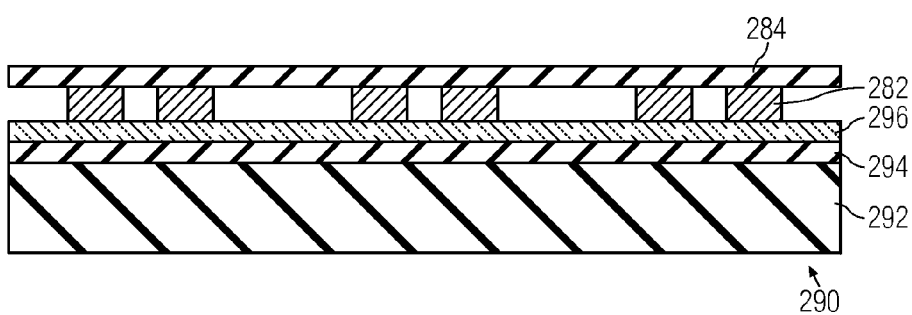

FIGS. 28 and 29 show another embodiment. FIGS. 28 and 29 are cross-sectional views of an embedded unit to illustrate another mounting method in accordance with an embodiment of the invention. FIG. 28 is a cross-sectional view 280 of embedded unit 282 showing a pre-prepared embedded unit on carrier release tape 284 such as ultraviolet (UV) tape, or the like. FIG. 29 is a cross-sectional view 290 of embedded unit 282 on carrier tape 284 with UV irradiation to polymerize UV tape adhesive for adhesion reduction. The carrier tape 284 is removed to release the embedded unit 282 on a glass substrate 292 with thermal release tape 294 and double sided silicon polyimide tape 296.

Figure 30:
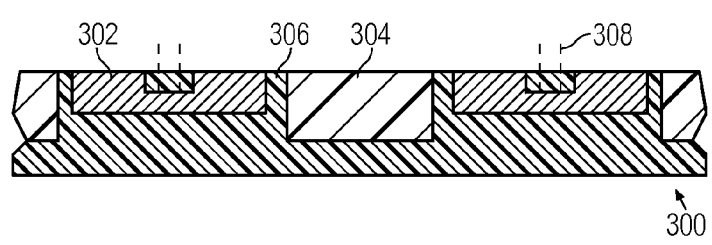
FIGS. 30 and 31 are enlarged cross-sectional views of an embedded unit with a half-etch link removed in accordance with an embodiment of the invention.
Figure 31:
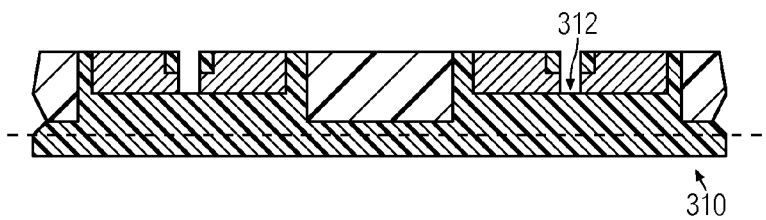

FIGS. 30 and 31 are cross-sectional views of an embedded unit with a half-etch link removed in accordance with an embodiment of the invention. FIG. 30 is a cross-sectional view 300 of an encapsulated panel sawn to embedded ground plane plate thickness at half-etch embedded ground plane plate 302 together with die 304, encapsulant 306, and region 308 of removal of encapsulant. FIG. 31 is a cross-sectional view 310 of an encapsulated panel sawn to embedded ground plane plate thickness at half-etch embedded ground plane plate with the half-etch link removed 312.

The horizontal dashed line shown in FIG. 31 differentiates between the top and bottom portion of the panel to show the source of warpage of the panel. Panel warpage occurs due to an imbalance of panel expansion between the top portion of the panel having the embedded die, the embedded ground plane, and the encapsulant and the bottom portion of the panel having only the encapsulant. Severe panel warpage is seen in conventional embedded ground plane plates such that the panel is not able to be held by vacuum to a chuck table. In conventional methods to address panel warpage, a panel stiffener is mounted to the panel. The disadvantage is that long chemical soak of typically 6 hours is required to release the ceramic stiffener from the panel if a physical ceramic substrate is used to assist in preventing the panel from warping. If warpage is reduced to acceptable level then ceramic stiffener is not needed.

In accordance with an embodiment of the invention, one way of reducing panel warpage is by reducing the area of the embedded components. In an embodiment, a configuration is shown with the formation of the half-etch embedded ground plane plate removed. This feature minimizes panel warpage. The embedded unit in accordance with an embodiment of the invention is by the nature of the design with reduced areas of material also acts to minimize panel warpage. In conventional embedded ground panel plates, further processing in accordance with an embodiment of the invention may be performed to reduce panel warpage. As described, once half-etch of the embedded ground plane plate is removed, a reduction in panel warpage is observed It is important that panels do not warp to such an extent that the warped panel is not able to be held down by a chuck table without manual assistance, such as clamping, costly ceramic stiffener, or the like. Although there may be some room for limited warpage, embodiments of the invention limit the amount of warpage such that the panel, even if slightly warped, is still able to be held down by a chuck table by vacuum without any further manual assistance eliminating the need for any additional type of ceramic stiffener. Empirical data has shown in simulation that a reduction from 3000 µm to 1800 µm, by about 40%, which is still in the range in which a panel can be held down by a chuck table vacuum. The panel may still be allowed to warp to a maximum amount of in the range of approximately, for example 2000 µm. It will be appreciated that the actual maximum permitted panel warpage may vary from 2000 µm and depends on the number of factors specific to each application, such as for example the number of dies, components, embedded units, and the like, in the panel. It has been observed that the quantity of dies, components, embedded units, or the like increases, the severity of warpage increases.

In this embodiment, the resulting removal of material at the half-etch link removed results in a groove running along the panel in this embodiment, for example 125 µm deep with 30 µm wide groove. In other embodiments, removal of material may be accomplished by other forms than a groove, such as the method discussed with reference to FIG. 19-29. After such a half-etch link removal, a panel is able to be held down by a chuck table vacuum without any additional manual, chemical, or the like assistance.

Embodiments of the invention of embedded units eliminate the embedded plane to encapsulate interface delamination propagation to embedded plane-dielectric interface during package sawing. A reason for this is the elimination of sawing through the embedded plane on the saw scribe with the embedded unit. Without sawing through the embedded plane, any interface delamination propagation is eliminated Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

While there has been described in the foregoing description embodiments of the invention, it will be understood by those skilled in the technology concerned that many variations or modifications in details of design or construction may be made without departing from the scope or purview of present invention as defined by the appended claims. The embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this description of the invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A method of packaging a semiconductor die, comprising:
   providing a process mounting surface having an encapsulating area;
   placing an embedded unit on the process mounting surface within the encapsulating area, wherein the embedded unit has a first surface, an inner surface and an outer surface, the first surface having a first opening defined by the inner surface through the embedded unit, and wherein the first surface is positioned on the process mounting surface for forming a first cavity;
   placing a first semiconductor die on the process mounting surface, wherein the first semiconductor die has electrical contacts for electrical connection with external circuitry, wherein the first semiconductor die is located within the first cavity such that the embedded unit inhibits movement of the first semiconductor die, wherein the first surface of the embedded unit has at least two openings therethrough, wherein the at least two openings have different dimensions;
   placing a second semiconductor die in a second cavity formed by a second opening; and
   covering the inner and outer surfaces of the embedded unit and the first and second semiconductor dies with an encapsulation material, thereby forming a packaged semiconductor device.

2. The method of packaging a semiconductor die of claim 1, wherein the process mounting surface is a substrate, and further comprising removing the process mounting surface to expose the electrical contacts of the first semiconductor die.

3. The method of packaging a semiconductor die of claim 1, wherein the process mounting surface comprises a surface on a layer within the packaged semiconductor device.

4. The method of packaging a semiconductor die of claim 1, further comprising:
   placing at least two, separate embedded units on the process mounting surface and within the encapsulating area; and
   placing at least one semiconductor die within each cavity of each embedded unit, and wherein the first surface of each of the at least two embedded units are spaced apart on the process mounting surface and separated by encapsulation material.

5. The method of packaging a semiconductor die of claim 4, further comprising forming at least two packaged semiconductor devices from the at least two embedded units without penetrating the at least two embedded units.

6. The method of packaging a semiconductor die of claim 4, wherein the at least two embedded units have different dimensions and are formed of different materials.

7. The method of packaging a semiconductor die of claim 1, wherein placing of the first semiconductor die on the process mounting surface occurs before placing the embedded unit on and within the encapsulating area of the process mounting surface.

8. The method of packaging a semiconductor die of claim 1, further comprising:
- placing at least two embedded units within the encapsulating area on the process mounting surface, wherein each of the at least two embedded units are joined;
- placing at least one semiconductor die within each cavity of each embedded unit; and
- removing material from between each adjacent embedded unit of the at least two embedded units to form a gap and separate the embedded units such that the first surfaces of each of the at least two embedded units are spaced apart on the process mounting surface and each of the at least two embedded units are separate and unjoined.

9. A packaged integrated circuit, comprising:
- a process mounting surface plane;
- an embedded unit having a first surface, at least two inner surfaces and an outer surface, the first surface having at least two openings through the embedded unit, wherein the at least two openings have different dimensions defined by the at least two inner surfaces, and the first surface on the process mounting surface plane;
- at least two integrated circuits each having a first surface and a second surface, the first surface of each of the integrated circuits on the process mounting surface plane, the integrated circuits respectively positioned within the at least two openings defined by the at least two inner surfaces of the embedded unit, the at least two integrated circuits having electrical contacts for electrical connection with external circuitry, the embedded unit and the at least two integrated circuits arranged to inhibit movement of the at least two integrated circuits during encapsulation; and
- an encapsulation material covering at least a portion of the outer surface of the embedded unit, the at least two inner surfaces of the embedded unit, and the second surface of each of the integrated circuits for forming the packaged integrated circuit.

10. The packaged integrated circuit of claim 9, wherein the process mounting surface plane is formed by a temporary surface that is removed to expose the electrical contacts of the integrated circuits.

11. The packaged integrated circuit of claim 10, wherein the temporary surface is a substrate, panel, or tape.

12. The packaged integrated circuit of claim 9, wherein the packaged integrated circuit comprises at least two layers and the process mounting surface plane is formed by a surface on a layer within the packaged integrated circuit.

13. The packaged integrated circuit of claim 9, further comprising:
- at least two embedded units on the process mounting surface plane, wherein each outer surface of the at least two embedded units are separated by encapsulating material;
- at least one integrated circuit is disposed on the process mounting surface plane within each cavity each embedded units; and
- each integrated circuit is separated by encapsulating material from the inner surface of each respective embedded unit.

14. The packaged integrated circuit of claim 9, wherein the packaged integrated circuit is formed from a single process mounting surface plane comprising at least two embedded units and singulated to form at least two integrated circuit packaged assemblies without penetrating any part of any one of the at least two embedded units.

15. The packaged integrated circuit of claim 9, further comprising at least two embedded units, each embedded unit having different dimensions and materials.

16. An embedded unit for a packaged integrated circuit, the embedded unit comprising:
- a body having a first surface, at least two inner surfaces, and an outer surface, wherein the first surface has at least two openings that extend through the embedded unit, wherein the two openings have different dimensions defined by the at least two inner surfaces;
- wherein the first surface is positioned on a process mounting surface within an encapsulating area for forming at least two cavities each to receive a semiconductor die on the process mounting surface;
- wherein the outer surface and the at least two inner surfaces are for being encapsulated by an encapsulant material; and
- wherein the embedded unit reduces movement of the semiconductor die on a process mounting surface during encapsulation.

* * * * *